United States Patent [19]

Jialanella

[11] Patent Number: 4,526,811

[45] Date of Patent: Jul. 2, 1985

[54] METHOD AND COMPOSITION FOR REPAIRING REAR WINDOW DEFOGGERS

[75] Inventor: Gary L. Jialanella, Maple Heights, Ohio

[73] Assignee: Loctite Corporation, Newington, Conn.

[21] Appl. No.: 545,900

[22] Filed: Oct. 27, 1983

[51] Int. Cl.$^3$ .............................................. B05D 5/12
[52] U.S. Cl. .................................... 427/108; 427/125; 427/140; 427/163; 427/165
[58] Field of Search .............. 427/108, 125, 140, 163, 427/165; 338/307, 308; 219/522; 252/514

[56] References Cited

U.S. PATENT DOCUMENTS

| | | | |
|---|---|---|---|
| 3,003,975 | 10/1961 | Louis et al. | 22/514 |
| 3,469,015 | 9/1969 | Warren | 338/308 |
| 3,654,187 | 4/1972 | Takenaka et al. | 252/514 |
| 3,705,047 | 12/1972 | Marriott | 427/108 |
| 3,932,311 | 1/1976 | Caldwell et al. | 252/514 |
| 4,054,714 | 10/1977 | Mastrangelo | 252/514 |
| 4,407,847 | 10/1983 | Boaz | 427/108 |

FOREIGN PATENT DOCUMENTS 4539975 6/1965 Japan .................................. 252/514

OTHER PUBLICATIONS

Encyclopedia of Polymer Science and Technology, 1964, vol. 1, p. 300.

*Primary Examiner*—Richard Bueker
*Attorney, Agent, or Firm*—Eugene F. Miller; Martey R. Perman

[57] ABSTRACT

An electrically conductive adhesive composition effective for repairing discontinuities in the electrically conducting metal lines of rear window defoggers is disclosed. The composition comprises (a) an acrylic ester polymer resin (b) a metallic pigment and (c) an organic pigment.

The composition is applied as a solid solution to the interrupted section of the metal line to bridge the gap in the line and the solvent is evaporated leaving an electrically conductive bridging layer which restores electrical flow to the line. The $T_g$ of the acrylic ester polymer resin should be such that the composition does not run, sag or otherwise lose its structural integrity when the metal line is heated to an operating temperature.

8 Claims, No Drawings

METHOD AND COMPOSITION FOR REPAIRING REAR WINDOW DEFOGGERS

BACKGROUND OF THE INVENTION

1. Field of the Invention

This invention relates to rear window defoggers which are installed on the inside surface of a motor vehicle's rear window for increasing the temperature of the rear window in order to clear the same of fog or frost and, more particularly, to such defoggers comprised of a plurality of narrow electrically conducting lines and an improved method and composition for repairing such lines in which cracks or other discontinuities render the lines non-conductive.

2. The Prior Art

Rear Window defrosters have become quite popular in motor vehicles used in colder climates and fall into two distinct classes, namely the factory installed version and systems which are sold in kit form to be installed on the rear window inside a car. The factory installed systems will last for many years, but they have the disadvantage that the very fine lines of conductive material tend to be quite fragile and can be easily damaged as when cleaning the window with an abrasive substance or when some sharp object is unintentionally allowed to move against the inside surface of the window.

The other variety of rear window defrosters is a defroster kit of the transfer type wherein a very thin foil of conductive material is transferred from a clear transparent support that eventually will be removed leaving only a pattern of relatively wide silver looking bands on the inside surface of the window, and some attachment to make the connection to the motor vehicle's electrical system. Passage of a current through the lines of the system generates sufficient heat to dissipate fogging or frost that would otherwise accumulate against the inside surface of the rear window. The heating elements of this system are extremely fragile, and the individual heating lines are also easily broken or interrupted resulting in an unsatisfactory defogging and defrosting of the rear window.

Compositions generally used to repair interrupted electrical heating lines in rear window defrosters are conductive glues which are used to bridge the discontinuity and re-establish conductivity thereacross. Such glues are generally comprised of a mixture about 50 to about 85 percent by weight of a conductive metallic pigment or flake such as silver or copper and about 15 to about 50 percent by weight of an adhesive binder such as an epoxy resin or solvent borne thermoplastics. Although these glues are effective for repairing small breaks in the conductive lines of the defroster, in the event the non-conductive area is a break or gap of appreciable length, the glue does not possess the requisite electrical conductivity to provide sufficient electrical energy to produce a suitable heating output in the repaired conductive line to maintain the window free from condensation or frost.

SUMMARY OF THE INVENTION

In accordance with the present invention, there is provided an electrically conductive adhesive composition effective for repairing discontinuities in an electrically conducting metal line applied to a glass surface of a window which composition is comprised of a solids mixture of about 35 to about 80 percent and preferably about 35 to about 45 percent by weight of electrically conductive metallic material, about 2 to about 12 percent and preferably about 4 to about 8 percent by weight of an acrylic ester polymer resin, about 0 to about 8 percent and preferably about 0 to about 3 percent by weight of an organic pigment, and the remaining composition being carrier solvent. The glass transition temperature of the resin should be such that the composition does not run, sag or otherwise lose its structural integrity when the metal line is heated to an operating temperature. A useful range of glass transition temperature is between about 20° C. and about 120° C. with a range of about 35° C. and about 80° C. being preferred.

PREFERRED EMBODIMENTS

Metallic particles useful in preparing the electrically conductive adhesive repair compositions of the present invention include silver, aluminum and copper particles, most advantageously in flake form.

Monomeric acrylic esters from which the acrylic ester polymers used in the practice of the present invention are prepared are represented by the formula

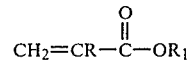

wherein R is hydrogen or methyl and $R_1$ is an alkyl group containing 1 to 8 carbon atoms, e.g. methyl, ethyl, propyl, isopropyl, butyl, hexyl, heptyl, 2-heptyl, 2-ethylhexyl, and cyclohexyl. Suitable polymers prepared from these monomers for use in the practice of the present invention include polymers and/or copolymers of methyl, ethyl, n-butyl and isobutyl methacrylate or acrylate, polymethyl methacrylate copolymers being preferred.

Acrylic ester polymers are distinguished by their water-clear color and their stability on aging which make them especially suitable for application to clear window structures as binders for defogger repair compositions. To a large extent, the physical properties of acrylic ester polymers depend on the molecular weight of the polymer. As is typical of polymeric systems, the mechanical properties of the acrylic ester polymers improve as the molecular weight is increased; however, beyond a critical molecular weight, that is, about 100,000–200,000, the improvement is slight and levels off asymptotically.

The glass transition temperature ($T_g$) or second-order transition temperature of acrylic ester polymers is controlled by the nature of the alkoxy group and is the temperature at which the polymer changes from a rubbery to a brittle material (glassy state). The glass transition, unlike a true thermodynamic transition, takes place over a temperature range of several degrees. Below the glass transition temperature, the majority of the polymer chains have a fixed configuration and little rotation of chains takes place. Above the glass transition temperature, the polymer chain has sufficient thermal energy for rotational motion or torsional oscillation to occur; thus, the glass transition temperature marks the onset of segmental mobility. During the transition, there is no significant absorption of latent heat; there is an abrupt increase in the specific volume, coefficient of expansion, compressibility, specific heat, and refractive index. The physical properties of acrylic ester polymers, which are dependent on the segmental relaxation rate, show a major change in the glass transition region.

The glass transition temperature indicates what mechanical properties may be expected of the acrylic ester polymers and the approximate temperature range over which these properties can be anticipated. Below the $T_g$, acrylic ester polymers are hard, brittle glasses; above the $T_g$, they are relatively soft, viscous rubbers.

Many other physical properties of acrylic ester polymers undergo dramatic changes in the transition temperature region. Among them are torsional modulus, load bearing capacity, hardness, tack, impact resistance, polymer flow, creep crystallizaton, heat capacity, thermal expansivity and dielectric properties. The $T_g$ of the acrylic ester polymers should be such that the composition does not run, sag or otherwise lose its structural integrity when the metal line or grid is heated to an operating temperature (i.e., up to about 100° C.). A useful range of $T_g$ is between about 20° C. and 120° C. with a range of about 35° C. and 80° being preferred.

It has thus been presently determined that acrylic ester polymers exhibit a substantial increase in electrical conductivity or conversely, a decrease in resistivity when heated above the $T_g$. For example, a polymethyl methacrylate copolymer available commercially from Rohm and Haas under the designation Acryloid B-48N having a $T_g$ of 50° C. exhibits an instantaneous resistivity change when heated to or above the glass transition temperature which is recorded in Table I.

TABLE I

| Temperature (°C.) | Resistivity (ohm-mm) × $10^{-3}$ | Conductivity (ohm-mm)$^{-1}$ × $10^2$ |
|---|---|---|
| 25 | 6.88 | 1.45 |
| 50 | 6.88 | 1.45 |
| 62 | 5.80 | 1.72 |
| 83 | 3.90 | 2.56 |
| 106 | 1.60 | 6.25 |

When heated for 2 hours over approximately the same temperature a similar change in resistivity occurs which is recorded in Table II.

TABLE II

| Temperature (°C.) | Initial Resistivity (ohm-mm) × $10^{-3}$ | Final Resistivity (ohm-mm × $10^{-3}$ |
|---|---|---|
| 25 | — | 3.44 |
| 37 | 3.44 | 3.19 |
| 50 | 5.16 | 5.08 |
| 82 | 2.00 | 1.28 |
| 100 | 4.00 | 1.50 |

Acryloid A-30 a second acrylic ester polymer available commercially by Rohm and Haas having a $T_g$ of 100° C. exhibits the following instantaneous resistivity when heated to or above the glass transition temperature which is recorded in Table III.

TABLE III

| Temperature (°C.) | Resistivity (ohm-mm) × $10^{-3}$ | Conductivity (ohm-mm)$^{-1}$ × $10^2$ |
|---|---|---|
| 25 | 3.77 | 2.65 |
| 50 | 3.77 | 2.65 |
| 80 | 3.20 | 3.12 |
| 100 | 1.58 | 6.33 |
| 110 | 1.01 | 9.90 |

When heated for 2 hours over approximately the same temperature range a similar change in resistivity occurs which is recorded in Table IV.

TABLE IV

| Temperature (°C.) | Initial Resistivity (ohm-mm) × $10^{-3}$ | Final (2 hour) Resistivity (ohm-mm) × $10^{-3}$ |
|---|---|---|
| 50 | 5.40 | 5.08 |
| 82 | 5.50 | 3.70 |
| 100 | 4.20 | 1.80 |

It is the increase in electrical conductivity that occurs above the $T_g$ of the acrylic ester polymer as recorded in the above Tables that makes the polymer especially useful as a binder material for the metallic pigmented, electrically conductive adhesive compositions used for repairing cracked or broken electrical heating lines in rear window defoggers in accordance with the practice of the present invention. Because of the increasing electrical conductivity above the $T_g$ of the acrylic ester polymer used as the binder for the repair composition, the defogger repair compositions of the present invention possess the requisite electrical conductivity to produce the required heat output in the repaired defogger line, the heat generated in the repaired electrically conductive lines of the defogger being sufficient to cause the temperature of the acrylic ester polymer to rise above its glass transition temperature.

The repair compositions of the present invention are prepared by blending the acrylic ester polymer binder along with high concentrations of organic solvents for the binder and the metallic pigment, using conventional blending means.

To improve the cosmetic properties of the repair composition, an organic pigment is incorporated into the blend formulation. The term "organic pigment" is defined as a compound containing carbon, hydrogen and frequently nitrogen and oxygen substituents which is used to alter the color of a system. Suitable organic pigments useful in the practice of the present invention include Diarylide Yellow, Diarylide Orange ($C_{32}H_{24}Cl_2N_3O_2$), Lithol Red, Red Lake C, Lithol Rubine, Red 2B, Bon Red C and Don Maroon. A translucent organic pigment sold under the designation DCC 1802 by the Dominion Colour Company Ltd is preferred in the preparation of the repair compositions of the present invention.

In preparing the repair compositions of the present invention, it will be found advantageous that the electrically conductive metallic material be a flake of a particle size finer than 20 microns in order to insure maximum conductivity and good dispersion throughout the solution containing the acrylic ester polymer binder. To insure the proper electrical conductivity of the repair composition, it will be particularly advantageous to employ about 35 to about 80 percent of the electrically conductive metallic material based on the total composition and preferably about 35 to about 45 percent by weight of the metallic pigment. If a color match is required, it will be particularly advantageous to include about 1 to about 8 percent by weight of the organic pigment based on total composition.

Organic solvents in which the acrylic ester polymer, metallic and organic pigments are dispersed should not react adversely with any of the components of the repair composition. Examples of suitable solvents in which the solid components of the repair composition may be dispersed include alcohols such as ethanol, butanol and isopropanol, aromatic hydrocarbons such as toluene and zylene and esters such as ethyl acetate, ethoxy ethyl acetate, butyl acetate and amyl acetate or mixtures thereof. An especially preferred solvent is a solvent blend of ethyl alcohol, ethyl acetate and ethoxyethyl acetate.

The concentration of the acrylic ester polymer solvent solution is preferably adjusted to accomodate the particular means of application of the repair composition to attain its most effective and economical administration. The repair composition comprises an organic solvent solution containing at least about 5% of the solid components. For brushing or dabbing applications, solution concentrations of solid components of the repair compositions are normally in the range of about 20% to about 90% by weight of the repair composition and for the most effective and uniform application preferably between about 45 to about 65% by weight.

A typical defogger repair composition of the present invention has the following formulation:

| Component | Weight Percent |
|---|---|
| Solids | |
| Silver Flake #9 | 41.79 |
| DCC 1802 | 2.41 |
| Acryloid B-48N | 6.01 |
| Solvent | |
| Ethyl Acetate | 21.76 |
| Ethyl Alcohol | 17.66 |
| Ethoxyethyl acetate | 10.37 |

This repair composition after application to the surface to be repaired is composed, after evaporation of the organic solvents, of a solid composition comprised of about 84% silver flake, 5% by weight translucent organic pigment and about 12% by weight acrylic ester polymer binder which exhibits excellent adhesion to glass, excellent abrasion resistance and when heated above the $T_g$ of Acryloid B-48N ($T_g = 50°$ C.), the repair composition exhibits increasing orders of conductivity as previously indicated in Table I.

Breaks or discontinuities in the lines of a rear window defroster which interrupt the desired flow of electrical energy through the line are repaired in accordance with the practice of the present invention by the application of a small amount of the repair composition at and over the area of the break. For this purpose, the area of the break to be covered with the repair composition is cleaned as for example by burnishing same with a relatively fine emery cloth or ink eraser and then applying the repair composition to the cleaned area by dabbing or brushing, being careful to overlap the ends of the broken lines so as to bridge the break with the electrically conductive repair composition. After allowing sufficient time for total evaporation of the solvents in which the solid components of the repair composition are dispersed, e.g. 1 to 24 hours depending upon ambient temperature conditions, the dab of repair composition will adhere to the glass surface of the cleaned area as well as to the metal lines of the defroster resulting in an electrically conductive bridging layer which will restore electrical flow to the gap in the damaged defroster line. Repairs performed with the repair compositions of the present invention have been found to provide a strong, adherent conductor in the area of the gap and an excellent conductive path for the electric current.

While specific components of the present system are defined above, many other variables may be introduced which may in any way affect, enhance or otherwise improve the coating systems of the present invention. These are intended to be included herein.

Although variations are shown in the present application, many modifications and ramifications will occur to those skilled in the art upon a reading of the present disclosure. These, too, are intended to be included herein.

I claim:

1. A method of repairing a rear window defogger comprised of a series of parallel spaced apart conductor lines fixed to the inside surface of a rear window, one or more of the lines being electrically interrupted and consequently inoperative, said method comprising the steps of cleaning the area of the rear window in the vicinity of the interrupted section of a line, applying a repair composition to the area in the vicinity of the interrupted portion of the line to bridge the interruption, the repair composition being a dispersion of an electrically conductive material in a volatile solvent solution of an acrylic ester polymer having a $T_g$ such that said composition does not lose its structural integrity upon heating of said lines to a temperature of up to about 100° C., and then evaporating the solvent to establish an electrically conductive path across the interrupted section of the lines.

2. The method of claim 1 wherein the repair composition contains an organic pigment.

3. The method of claim 1 wherein said $T_g$ is in the range of about 20° C. to about 120° C.

4. The method of claim 1 wherein said $T_g$ is in the range of about 35° C. to about 80° C.

5. The method of claim 1 wherein the acrylic ester polymer is a polymethyl methacrylate copolymer.

6. The method of claim 1 wherein the metallic material is silver flake.

7. The method of claim 1 wherein the solids content of the repair composition is comprised of about 2 to about 12 percent by weight of the acrylic ester polymer, about 35 to about 80 percent by weight of electrically conductive metallic particles and about 0 to about 8 percent by weight of the organic pigment.

8. The method of claim 6 wherein the repair composition is comprised of an organic solvent solution containing at least about 5% of the solid components.

* * * * *